United States Patent [19]
Takano

[11] Patent Number: 5,519,721
[45] Date of Patent: May 21, 1996

[54] MULTI-QUANTUM WELL (MQW) STRUCTURE LASER DIODE/MODULATOR INTEGRATED LIGHT SOURCE

[75] Inventor: Shinji Takano, Tokyo, Japan

[73] Assignee: NEC Corporation, Tokyo, Japan

[21] Appl. No.: 204,454

[22] Filed: Mar. 2, 1994

[30] Foreign Application Priority Data

Mar. 3, 1993 [JP] Japan ................................ 5-041642

[51] Int. Cl.$^6$ ........................................... H01S 3/18
[52] U.S. Cl. .................................... 372/48; 372/50/26
[58] Field of Search ........................... 372/96, 50, 26, 372/32, 45, 43

[56] References Cited

U.S. PATENT DOCUMENTS

| | | | |
|---|---|---|---|
| 4,751,710 | 6/1988 | Yamaguchi et al. | 372/50 |
| 4,873,691 | 10/1989 | Uomi et al. | 372/96 |
| 5,020,153 | 5/1991 | Choa et al. | 372/96 |
| 5,042,049 | 8/1991 | Ohtoshi et al. | 372/45 |
| 5,132,981 | 7/1992 | Uomi et al. | 372/45 |
| 5,177,758 | 1/1993 | Oka et al. | 372/50 |
| 5,305,343 | 4/1994 | Allovon et al. | 372/45 |
| 5,325,382 | 6/1994 | Emura et al. | 372/26 |

OTHER PUBLICATIONS

S. Takano et al., "1.55 μm Wavelength-Tunable MQW-D-BR-LDs Employing Bandgap Energy Control in All Selective MOVPE Growth", Otsu, Shiga, Japan, pp. 177–180. 1992 (No month available).

T. Kato et al., "Novel MQW DFB Laser Diode/Modulator Integrated Light Source Using Bandgap Energy Control Epitaxial Growth Technique", Kawasaki, Kanagawa, Japan, pp. 429–432. (1991) No month available.

E. Colas et al., "Lateral and Longitudinal Patterning of Semiconductor Structures by Crystal Growth on Nonplanar and Dielectric–Masked GaAs Substrates: Application to Thickness–modulated Waveguide Structures", North Holland, pp. 226–230.

O. Kayser, "Selective Growth of InP/GaInAs in LP–MOVPE and MOMBE/CBE", Journal of Crystal Growth 107, 1991, North Holland, pp. 989–998. (No month available).

*Primary Examiner*—Rodney B. Bovernick
*Assistant Examiner*—Robert McNutt
*Attorney, Agent, or Firm*—Young & Thompson

[57] ABSTRACT

A multi-quantum well (MQW) structure type semiconductor integrated laser element is constituted by a laser diode section and an optical modulator section which is integrated with the laser diode section and which contains a multi-quantum well structure. The multi-quantum well structure of the optical modulator section is a coupled multi-quantum well structure in which quantum states of the quantum wells are coupled with one another, thereby forming mini-bands. The large amounts of carriers produced by absorption are quickly scattered and lost through the mini-bands thereby enabling the modulation in proportion to the intensity of the electric field for modulation. The MQW integrated semiconductor laser element thus obtained exhibits excellent modulation characteristics and provides high output, and can be fabricated at a low cost with a high production yield.

4 Claims, 4 Drawing Sheets

MULTI-QUANTUM WELL (MQW) STRUCTURE LASER DIODE/MODULATOR INTEGRATED LIGHT SOURCE

BACKGROUND OF THE INVENTION

1. Field of the Invention

The present invention relates to a multi-quantum well (MQW) structure semiconductor laser element, and more particularly to a multi-quantum well structure semiconductor laser element into which an optical modulator is integrated.

2. Description of the Related Art

Recently, the studies on ultra-high speed and large capacity data communication and data processing systems utilizing optical techniques are rapidly advancing, and the availability of advanced growth techniques such as a metal-organic vapor phase epitaxy (MOVPE) has stimulated the research and development of various elements such as an ultra-high speed semiconductor photonic element whose operation speed is beyond 2 Gb/s, a quantum well structure element, a surface emitting type semiconductor laser, and a semiconductor photonic integrated circuit (SPIC).

The ultra-high speed semiconductor photonic elements include, as examples, a Distributed Feedback Laser Diode (DFB LD) and a Distributed Bragg Reflector Laser Diode (DBR LD). However, where the semiconductor laser is directly modulated, the spectrum width increases due to the changes in refractive indices in laser media that are caused by changes in injected carriers, and this results in the so-called "dynamic wave chirping". This wave chirping becomes a cause for limiting the transmission distance for high speed modulation, so that an external modulator which does not rely on the direct modulation has been proposed.

The examples of the modulators using semiconductor include a bulk type modulator in which a bulk semiconductor is employed as an absorption layer and which utilizes shifts of absorption edge due to Franz-Keldysh effects, and a quantum well structure modulator which utilizes shifts of absorption edge are larger than in the bulk type modulator due to Quantum-Confined Stark Effects (QCSE). Another example is a Mach-Zehnder type modulator which utilizes optical phase modulation on the principle of Mach-Zehnder interferometer.

Along with the fast and remarkable advancement in recent years in the crystal growth techniques, such as MOVPE (metal-organic vapor phase epitaxy) and MBE (molecular beam epitaxy), for growing thin films, it has become possible to form a high quality semiconductor hetero-junction interface having steep composition variations whose precision is accountable by a thickness of an atomic mono-layer. The potential well structure and the grating structure having the above-mentioned hetero-junction have special optical and electrical characteristics attributable to wave nature of electrons, and the application of these characteristics to the fabrication of devices is being vigorously pursued.

Recent publications demonstrating the control of compositions and thicknesses of semiconductor layers within semiconductor substrates are attracting considerable attention. For example, there is a report by O. Kayser in Journal of Crystal Growth, No. 107 (1991), pp. 989–998 on selective growth using an $SiO_2$ film as a mask. Also, there is a report by K. Kato et al. in European Conference on Optical Communication of 1991, WeB7-1 on an optical modulator integrated type MQW DFB Laser Diode, in which the mechanism of selective growth as above is utilized. Also, Takano et al. have reported in ECOC' 1992, TuB5-3 on Wavelength-Tunable MQW—DBR—LDs, in which the selective growth mechanism as above is also utilized.

With the integrated type modulator as above, the advantages achieved are that the output is high because there is no interconnection loss unlike with a discrete modulator requiring connection by an optical fiber, and that the handling is easy and secured because no complex optical systems are used.

However, in the multi-quantum well type modulator as described above, the carriers produced by the absorption of light are blocked from flowing out due to potential barrier walls of the multi-quantum well and are piled up in the multi-quantum well. The problems which result therefrom include the deterioration of the optical quenching ratio due to the internal electric field produced by the piled-up carriers.

Also, in the Mach-Zehnder type modulator described above, since the phase modulation is utilized, the element is long so that, in the case of an integrated type, one of the problems is that the dimension of the element becomes large thereby placing limitations to modulation bandwidth.

SUMMARY OF THE INVENTION

An object of the invention, therefore, is to overcome the problems existing in the prior art and to provide an improved MQW DFB laser diode-modulator integrated light source, in which modulation characteristics are excellent and outputs are high and which can be fabricated at low cost with high production yield.

According to one aspect of the invention, there is provided a multi-quantum well structure type integrated semiconductor laser element comprising:

a laser diode section; and an optical modulator section which is integrated with the laser diode section and which contains a multi-quantum well structure, the multi-quantum well structure of the optical modulator section being a coupled multi-quantum well structure in which quantum states of the quantum wells are coupled with one another.

The multi-quantum well structure of the optical modulator section in the MQW DFB laser diode/modulator element includes a barrier layer whose thickness is so thin as to cause the quantum states to be coupled with one another.

Also, according to the invention, a semiconductor substrate is either InP or GaAs, and a well layer and a barrier layer constituting the multi-quantum well structure is $In_xGa_{1-x}As_yP_{1-y}$ ($0 \geq X, Y \geq 1$). The barrier layer may be an impurity-doped layer.

The invention is featured in that, in the multi-quantum well structure semiconductor laser element in which semiconductor layers containing a multi-quantum well structure are stacked and laminated, the multi-quantum well structure of which quantum states of the quantum wells are coupled with one another is utilized as the modulator section. The MQW DFB laser diode/modulator integrated light source thus obtained exhibits excellent modulation characteristics and provides high output, and can be fabricated at a low cost with a high production yield.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained hereunder with reference to the accompanying drawings.

Figure 1:
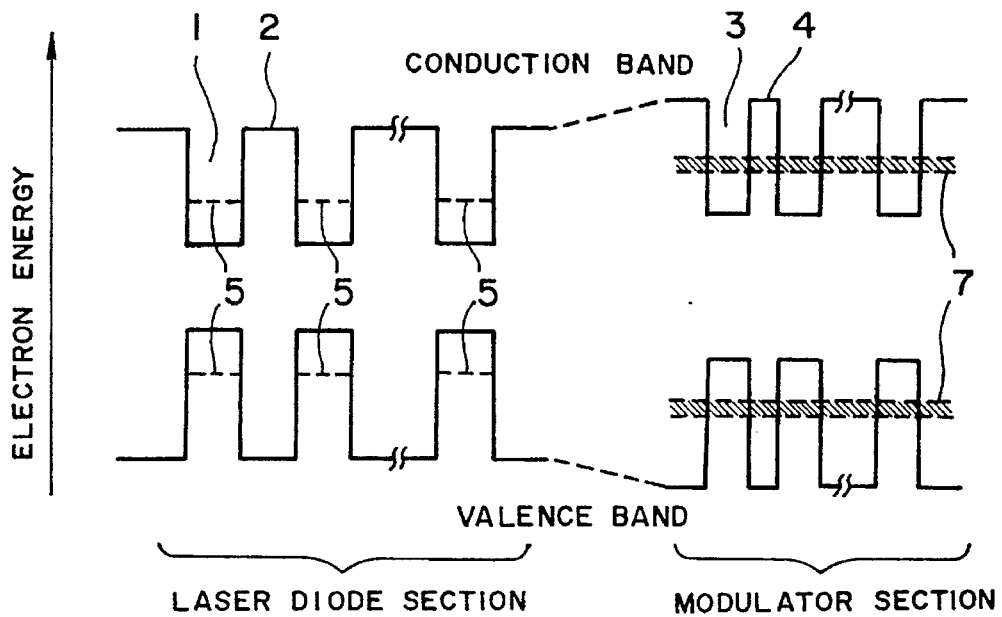
FIG. 1 is a band diagram for explaining a multi-quantum well structure of a first embodiment according to the invention.

FIG. 1 is a band diagram for illustrating a multi-quantum well structure of an LD (laser diode) section and a modulator section of an MQW DFB laser diode/modulator integrated light source of a first embodiment according to the invention. At the LD section, the barrier layers 2 are thick and the quantum states 5 are independent with one another but, at the modulator section, the barrier layers 4 are thin so that, due to the overlapping of wave functions, the well structure results in coupled quantum wells, thereby forming mini-bands 7.

Figure 2:
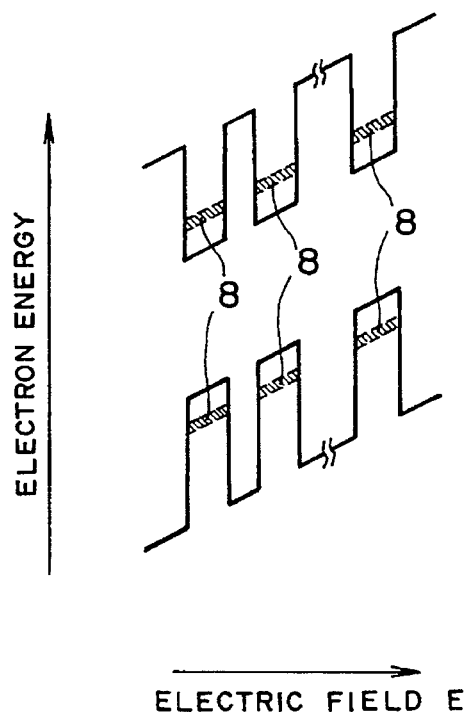
FIG. 2 is a band diagram for explaining the operation of the multi-quantum well structure of the first embodiment according to the invention.

With respect to the structure described above, explanations are given on the operations of modulation in cases where the electric field is applied to and is cut from the modulator section. FIG. 2 shows a band diagram of the modulator section where the electric field E is applied to the modulator section. As seen therein, by the application of the electric field to the modulator section, the potential differences are caused to be produced between the quantum states of the respective quantum wells, whereby the quantum wells turn to non-coupled quantum wells. At this time, a sufficient optical quenching characteristic is obtained due to the Quantum-Confined Stark Effect (QCSE). On the other hand, where the electric field is cut off from the modulator section, the quantum wells become coupled quantum wells so that the large amounts of carriers produced by absorption are quickly scattered and lost through the mini-bands 7, thereby enabling the modulation in proportion to the intensity of the electric field for modulating.

Figure 5:
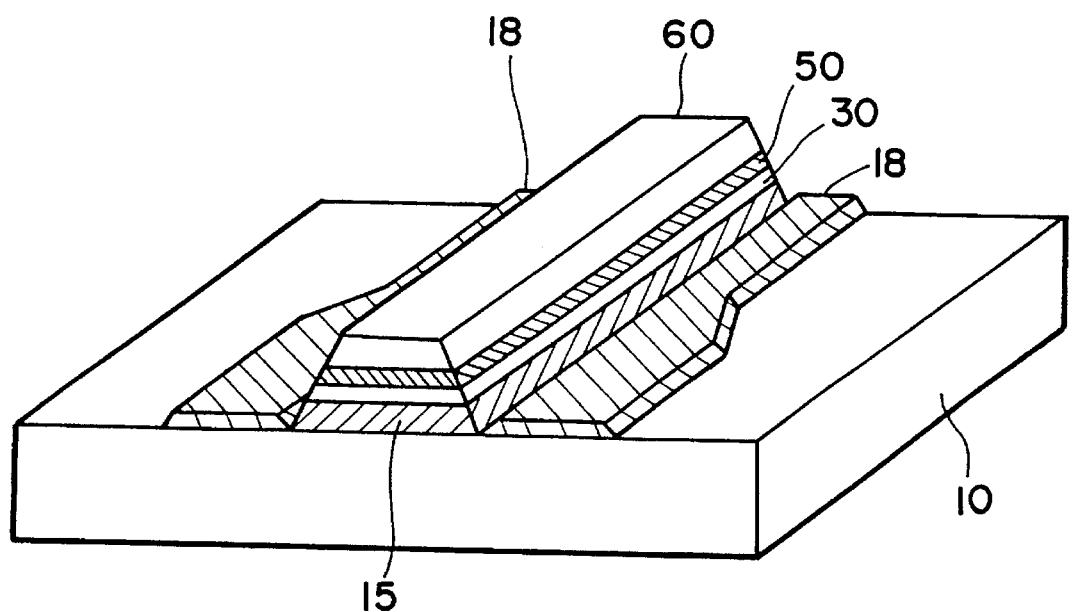
FIG. 5 is a perspective view of a structure fabricated according to the invention for explaining the processes used for controlling the thicknesses of layers during the fabrication of the structure.

The changes in compositions and thicknesses of well layers and barrier layers within an element can be realized by a selective growth method such as MOVPE. FIG. 5 is referred to for explaining such a method. Where $SiO_2$ masks 18 are formed in stripe shapes on a semiconductor substrate 10 followed by the growth of a crystal, the $SiO_2$ films serve as masks during the growth of the crystal. By varying the widths of such $SiO_2$ masks 18, it is possible to control the thicknesses and the compositions of the semiconductor layer that is grown at a selective growth region sandwiched between the $SiO_2$ masks 18. FIG. 5 shows an example wherein the multi-quantum well (MQW) 50 is grown and, in this case, a band-gap becomes smaller in regions at which the mask widths are wider. In FIG. 5, illustration of portions which grow outside the $SiO_2$ masks is omitted for convenience of explanation. The numeral 15 depicts an optical waveguide layer, 30 depicts an n-InP layer, and 60 depicts a p-InP layer.

Figure 3:
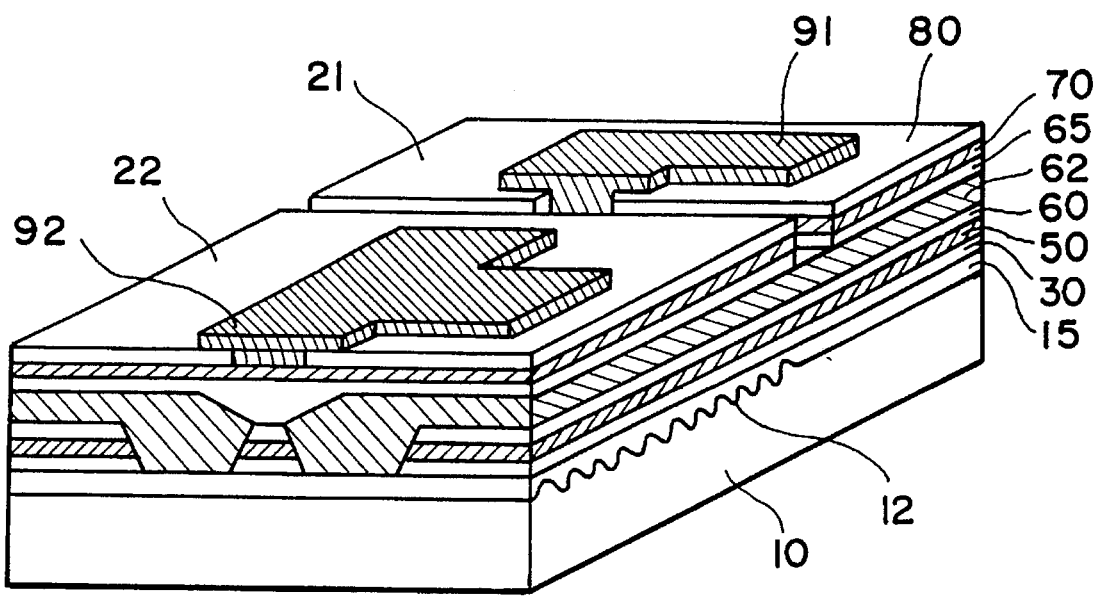
FIG. 3 is a perspective view of the multi-quantum well structure of the first embodiment according to the invention.
Figure 4A:
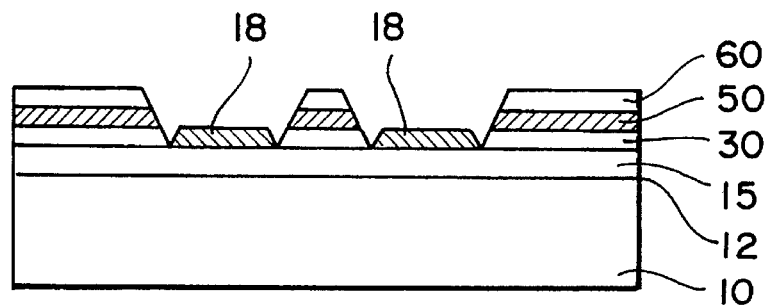
FIGS. 4A–4C are sectional views for explaining the fabrication steps of the multi-quantum well structure of the first embodiment according to the invention.
Figure 4B:
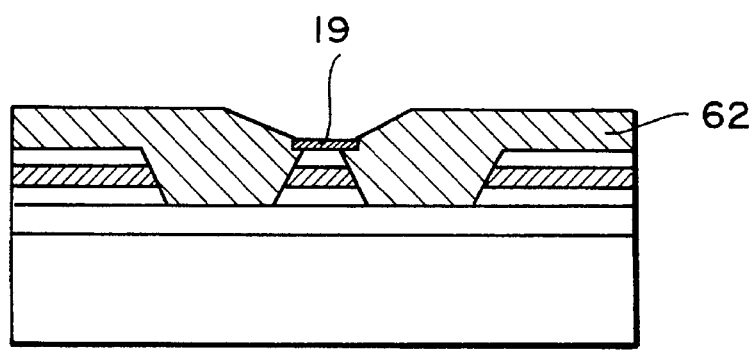
Figure 4C:
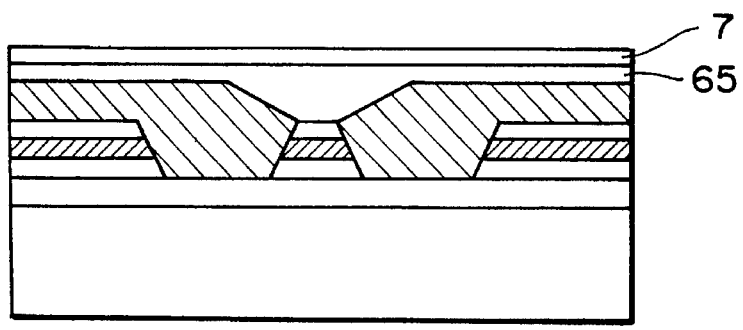

FIG. 3 shows, in a perspective view, an optical modulator integrated type MQW—DFB—LD according to the invention. FIGS. 4A–4C are for illustrating the sequential steps for fabricating the element of the invention. As seen in FIG. 4A, on a semiconductor substrate 10 on a part of which a diffraction grating 12 is formed, an optical waveguide layer 15 (1.25 μm wavelength composition InGaAsP with 0.12 μm in thickness) is grown. Then, the $SiO_2$ masks 18 are formed in such a way that the selective growth portion (LD section: 250 μm in length) 22 above the diffraction grating 12 is 10 μm in width and other portions (Modulator section: 150 μm in length) 21 are 4 μm in width. Thereafter, an n-InP layer 30 (layer thickness at the modulator section being 300 Angstroms and carrier concentration being $5\times10^{17}$ $cm^{-3}$), a multi-quantum well layer 50 (5-layered well) and a p-InP clad layer 60 (layer thickness at the modulator section being 0.2 μm and carrier concentration being $5\times10^{17}$ $cm^{-3}$) are stacked sequentially in this order. In this case, the compositions and the thicknesses within the element vary according to the mask widths as explained above. That is, at the modulator section, the composition wavelength is shorter and the layer is thinner as compared with those at the LD section. Specifically, at the MQW at the LD section, the well layer is $In_xGa_{1-x}As$ (1.67 μm wavelength composition, X=0.53, layer thickness being 7 nm) and the barrier layer is InGaAsP (1.15 μm wavelength composition, layer thickness being 3 nm) and has a band-gap energy (0.8 eV) corresponding to the wavelength of 1.55 μm. Also, at the modulator section, the well layer has changed to $In_xGa_{1-x}As$ (X=0.56, layer thickness being 4 nm) and the barrier layer has changed to InGaAsP (layer thickness being 1.6 nm).

After the above procedure, the $SiO_2$ masks 18 which have been used for the selective growth is removed and, as seen in FIG. 4B, another $SiO_2$ mask 19 is formed in a stripe form on a waveguide layer followed by the formation of a semi-insulation InP layer (Fe doped) 62 having a thickness of about 1.5 μm. Then, as seen in FIG. 4C, after the stripe $SiO_2$ mask 19 on the waveguide layer is removed, a p-InP layer 65 (layer thickness being about 0.3 μm and carrier concentration being $7\times10^{17}$ $cm^{-3}$) and a $p^+$-InGaAsP contact layer 70 (layer thickness being about 0.25 μm and carrier construction being $8\times10^{18}$ $cm^{-3}$) are grown. Thereafter, an $SiO_2$ insulation film 80 for reducing capacitance and pad electrodes 91 and 92 are formed, whereby an optical modulator integrated type MQW—DFB—LD as shown in FIG. 3 is obtained.

In the above element, the optical quenching ratio at the modulation voltage 2 Volts is not less than 18 dB and, even under the modulation at 10 Gb/s the modulation characteristics obtained are extremely good. As explained above, since the selective growth has been used, the coupling efficiency between the LD section and the modulator section is extremely high and also, since the waveguide involves little internal loss, the output obtained is very high. Also, since the element is fabricated through vapor phase growth and patterning processes, the production yield thereof is high.

Figure 6:
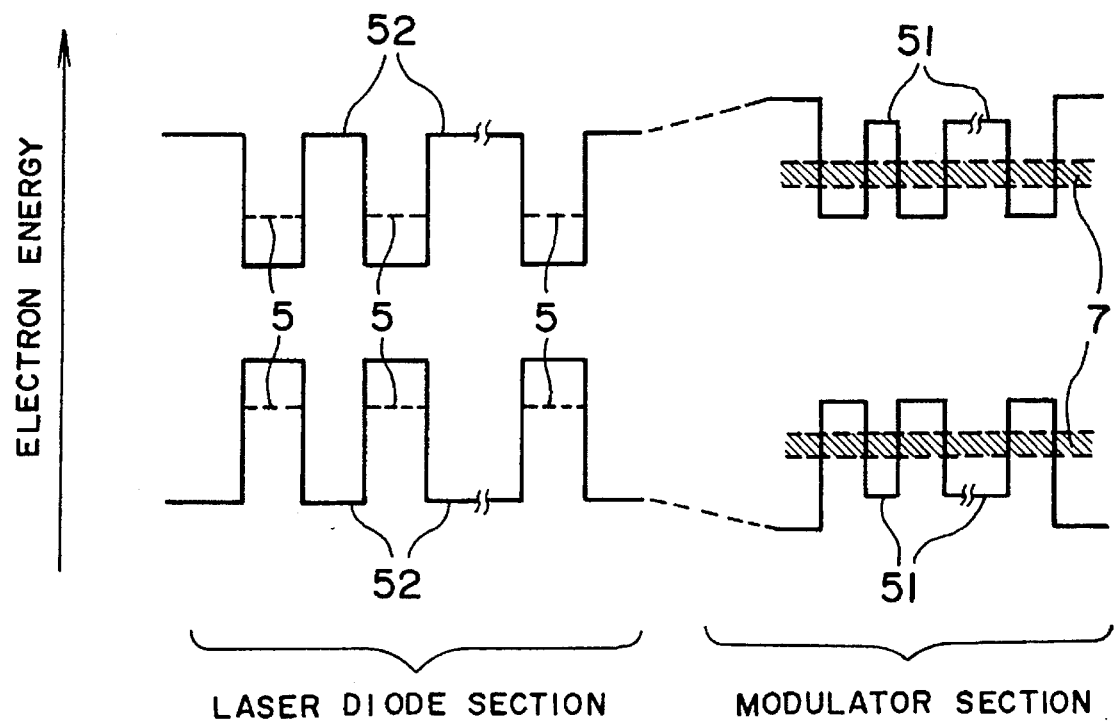
FIG. 6 is a band diagram for explaining a multi-quantum well structure of a second embodiment according to the invention.

FIG. 6 shows a band diagram for the LD section and the modulator section of an optical modulator integrated type MQW—DFB—LD of a second embodiment according to the invention. The point which is different in this second embodiment from the first embodiment is that the impurity is selectively introduced (modulation doped) only in central portions of the barrier layers of the multi-quantum well. As indicated by the band diagram, the barrier layers 51 at the modulator section are thinner than the barrier layers 52 at the LD section and, due to the loosening or the breakdown of the quantum-well interface, it is possible to form a mini-band only in the modulator section. Also, due to the impurity doped, the life of carriers becomes short, which is effective in the enhancement of bandwidth.

Specifically, at the MQW in the LD section, the well layer is InGaAs (layer thickness being 7 nm) and the barrier layer is InGaAsP (1.25 μm wavelength composition, and layer thickness being 5 nm) while, at the modulator section, the well layer is InGaAs (layer thickness being 4 nm) and the barrier layer is InGaAsP (layer thickness being 2.8 nm). Silicon (Si) is doped at $3 \times 10^{18}$ cm$^{-3}$ only at a 40% center region of each of the barrier layers.

In the above explained embodiments, InP type semiconductors have been referred to as examples. However, it is to be noted that the present invention can be effectively applied also to GaAs type semiconductors.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A multi-quantum well structure type integrated semiconductor laser element comprising:

a laser diode section; and an optical modulator section which is integrated with said laser diode section and which contains a multi-quantum well structure, said multi-quantum well structure of said optical modulator section being a coupled multi-quantum well structure in which quantum states of the quantum wells are coupled with one another, thereby forming mini-bands, said multi-quantum well structure comprising an impurity-doped barrier layer whose thickness is so thin as to cause said quantum states to be coupled with one another.

2. The multi-quantum well structure types integrated semiconductor laser element according to claim 1, which comprises a semiconductor substrate and a well layer, said semiconductor substrate being InP, and said well layer and said impurity-doped barrier layer constituting said multi-quantum well structure being $In_xGa_{1-x}As_yP_{1-y}(0 \leq X, Y \leq 1)$.

3. The multi-quantum well structure type integrated semiconductor laser element according to claim 1, which comprises a semiconductor substrate and a well layer, said semiconductor substrate being GaAs and said well layer and impurity-doped said barrier layer constituting said multi-quantum well structure being $In_xGa_{1-x}As_yP_{1-y}(0 \leq X, Y \leq 1)$.

4. A multi-quantum well structure type integrated semiconductor laser element comprising:

a laser diode section; and an optical modulator section which is integrated with said laser diode section and which contains a multi-quantum well structure, said multi-quantum well structure of said optical modulator section being a coupled multi-quantum well structure in which quantum states of the quantum wells are coupled with one another, thereby forming mini-bands, said multi-quantum well structure comprising a silicon (Si) doped barrier layer whose thickness is so thin as to cause said quantum states to be coupled with one another.

* * * * *